(12) United States Patent
Ono et al.

(10) Patent No.: US 7,296,471 B2
(45) Date of Patent: Nov. 20, 2007

(54) ACCELERATION SENSOR

(75) Inventors: Masaaki Ono, deceased, late of Yokohama (JP); by Nobuko Ono, legal representative, Yokohama (JP); Hiroshi Ishikawa, Kawasaki (JP); Hiroshi Tanaka, Yokohama (JP); Sumio Yamada, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 11/227,202

(22) Filed: Sep. 16, 2005

(65) Prior Publication Data

US 2006/0130584 A1    Jun. 22, 2006

(30) Foreign Application Priority Data

Dec. 16, 2004   (JP) .............................. 2004-364927

(51) Int. Cl.
*G01P 15/00* (2006.01)

(52) U.S. Cl. .................................................. 73/514.36
(58) Field of Classification Search .............. 73/514.36
See application file for complete search history.

(56) References Cited

U.S. PATENT DOCUMENTS

| | | | | |
|---|---|---|---|---|
| 5,081,867 A | * | 1/1992 | Yamada .................... | 73/514.33 |
| 5,239,870 A | * | 8/1993 | Kaneko .................... | 73/514.33 |
| 5,520,051 A | * | 5/1996 | Fujii et al. ............... | 73/514.36 |

FOREIGN PATENT DOCUMENTS

| | | | |
|---|---|---|---|
| JP | 03-202778 B2 | | 9/1991 |
| JP | 4-81630 | | 3/1992 |
| JP | 06-242139 A | | 9/1994 |
| JP | 08-105913 A | | 4/1996 |
| JP | 08105913 A | * | 4/1996 |
| JP | 11-51967 | | 2/1999 |
| JP | 2000-304762 A | | 11/2000 |
| JP | 2001-242191 A | | 9/2001 |
| JP | 2001242191 A | * | 9/2001 |
| JP | 2003215154 A | * | 7/2003 |
| JP | 2004-184081 | | 7/2004 |
| JP | 2004-233072 | | 8/2004 |
| KR | 1020040047684 | | 6/2004 |

* cited by examiner

*Primary Examiner*—Hezron Williams
*Assistant Examiner*—Samir M. Shah
(74) *Attorney, Agent, or Firm*—Arent Fox LLP.

(57) ABSTRACT

A structure with superior shock resistance is proposed for a parasol-type acceleration sensor. The acceleration sensor comprises a support portion the lower end of which is fixed to a substrate; a beam portion on which a detection element for applying changes to an output signal in correspondence with strain caused by acceleration acting on the detection element is formed, one end of the beam portion being connected to the top part of the support portion; a suspended weight connected to the other end of the beam portion; and a stopper substrate with a window portion through which, in order to guide an output signal of the detection element via a pad that is formed on the upper end face of the support portion, a conductor lead that is connected to the pad passes. Overswing of the weight is limited by means of the stopper substrate.

3 Claims, 7 Drawing Sheets

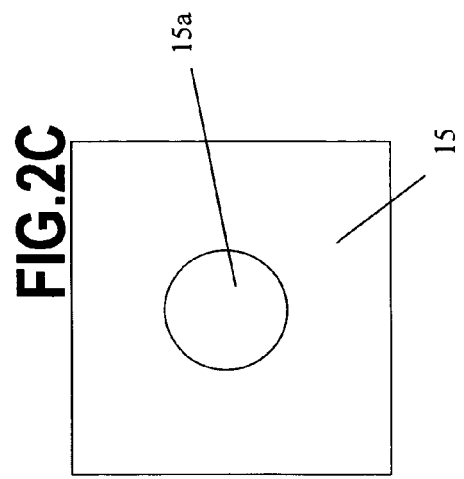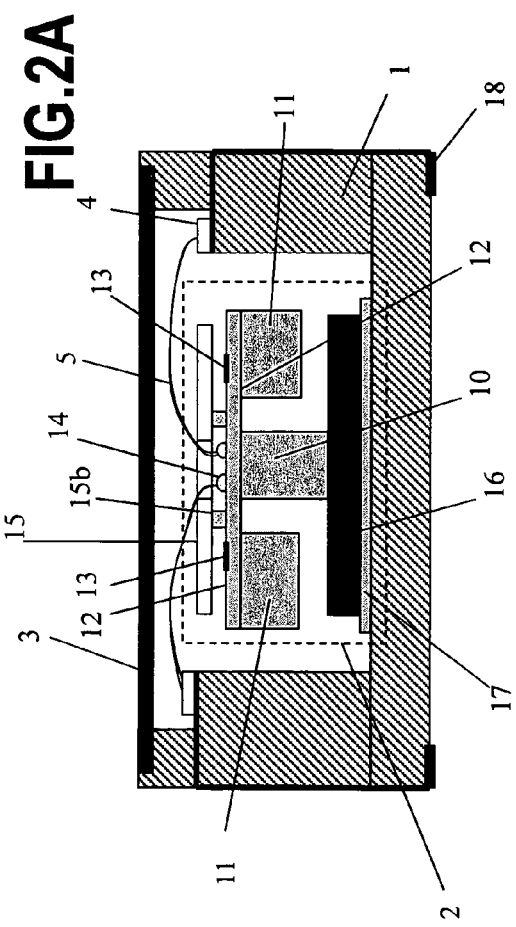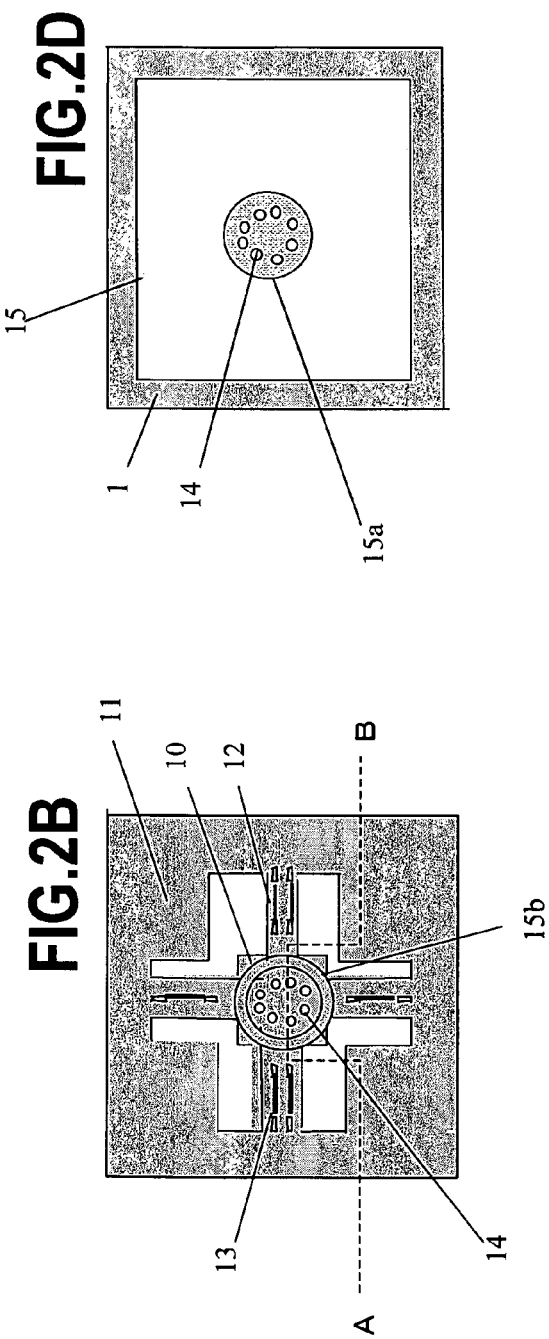

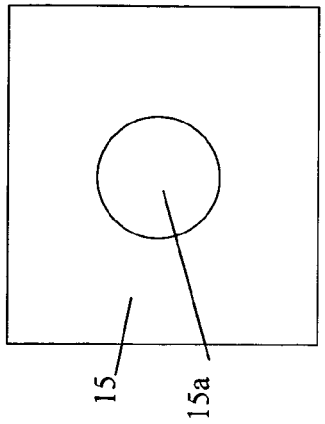
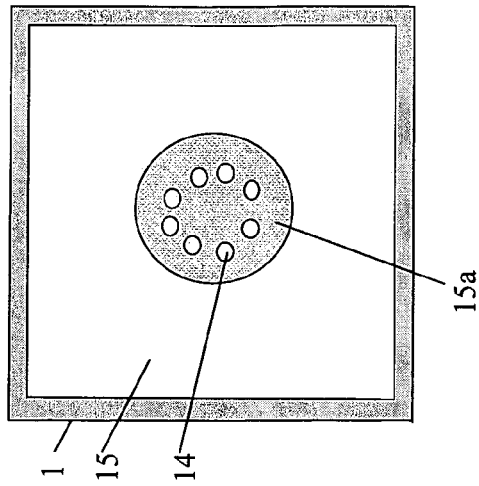
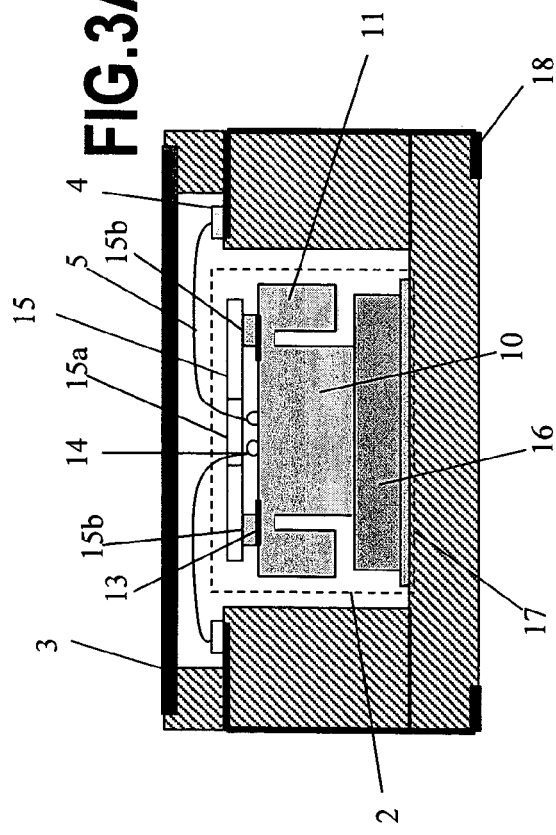
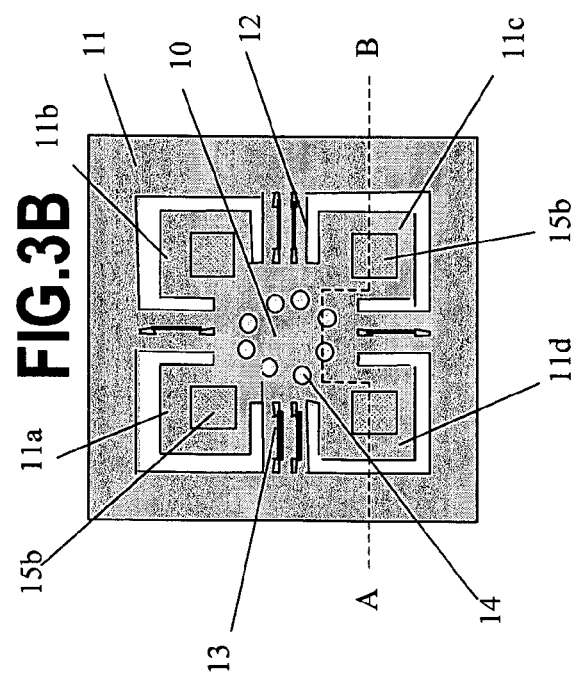

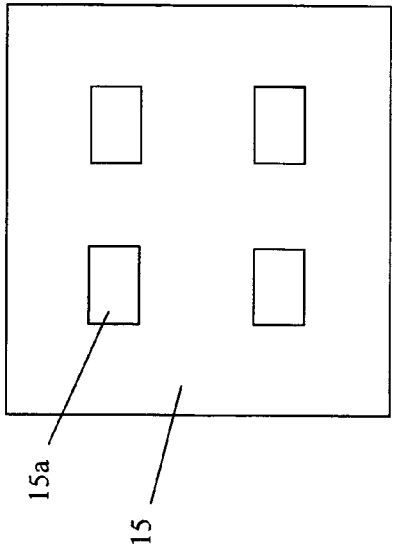
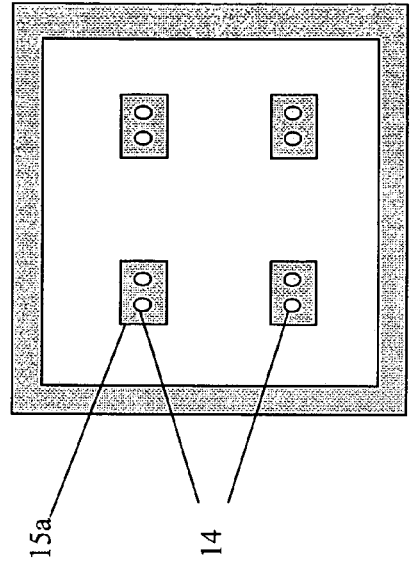
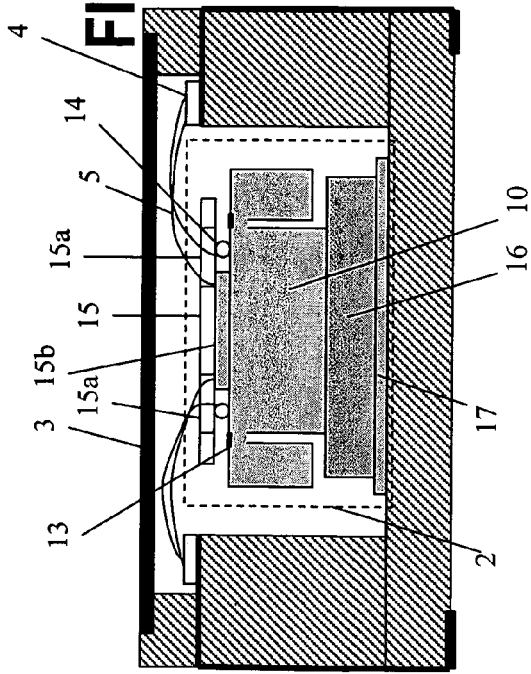
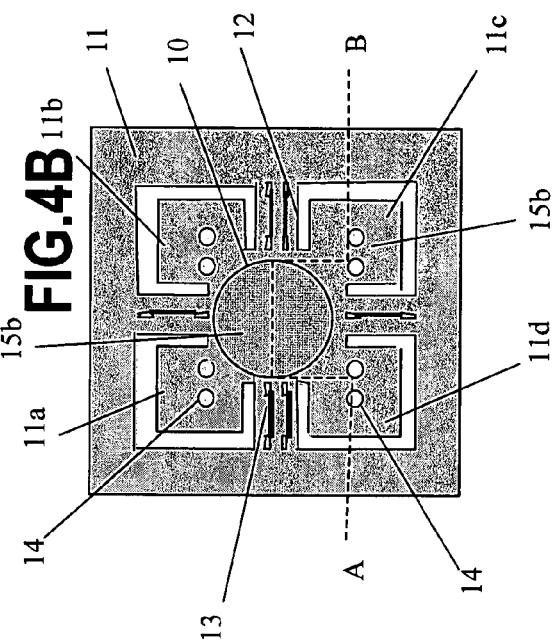

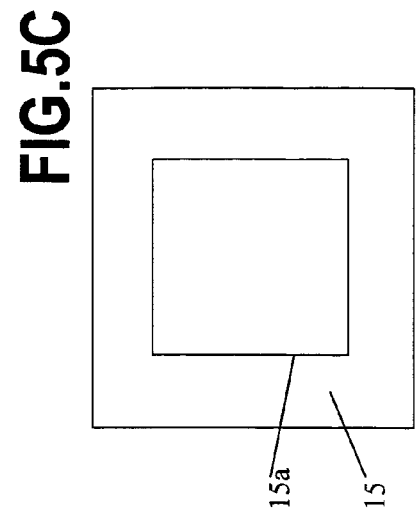
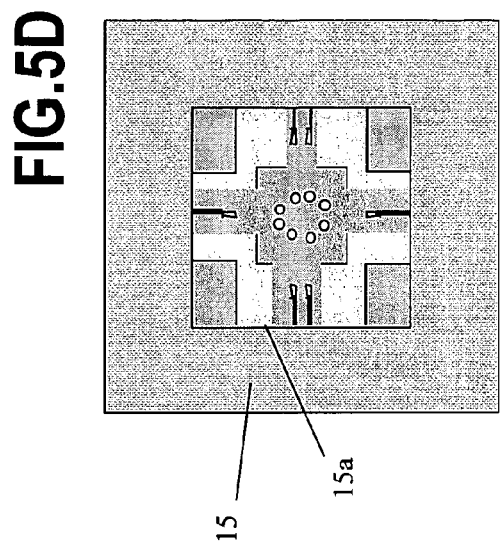
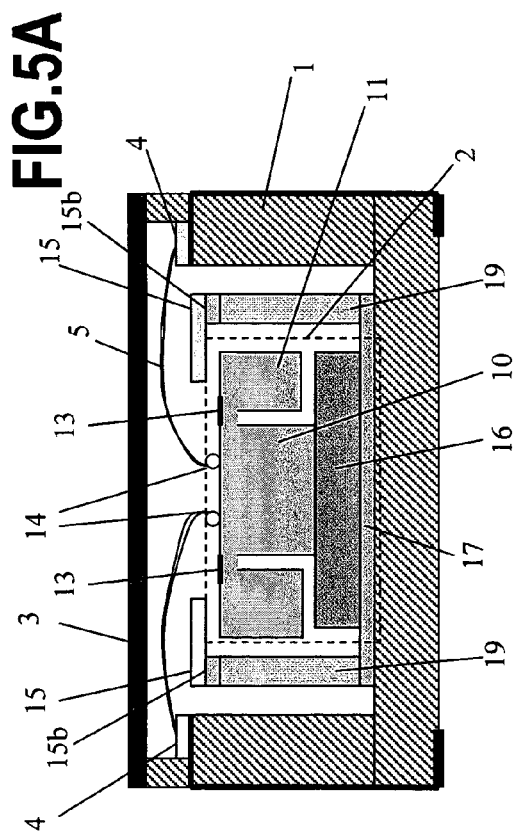
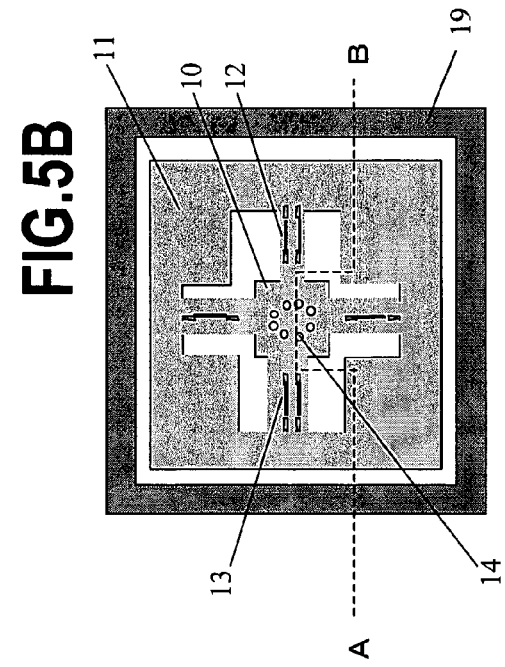

ACCELERATION SENSOR

CROSS-REFERENCE TO RELATED APPLICATION

This application is based upon and claims the benefit of priority from the prior Japanese Patent Application No. 2004-364927, filed on Dec. 16, 2004, the entire contents of which are incorporated herein by reference.

BACKGROUND OF THE INVENTION

1. Field of the Invention

The present invention relates to an acceleration sensor and, more particularly, to a semiconductor acceleration sensor with improved shock resistance.

2. Description of the Related Art

In order to implement various types of control in moving bodies such as automobiles and ships and in robots, mechanical fabrication devices, or mobile devices that are grasped and used by a user, such as notebook PCs, portable telephones, PDA (Personal Digital Assistant), DVC (Digital Video Camera), DSC (Digital Still Camera), for example, it is essential to detect the stress acting on all or part of the target body in correspondence with the objective of the control. By sensing the stress on the basis of the acceleration acting on all or part of the target, it is possible to sense the acceleration.

A variety of devices for detecting this stress or acceleration have been conventionally developed, of which one device is known in which a gauge resistor is formed on the semiconductor substrate as a detection element and which converts the mechanical strain produced on the basis of a force acting on the that is supplied from outside into an electrical signal as a result of the piezoresistive effect ("Development of three-weight sensor" 'Invention' Journal pages 52 to 63, published by the Invention Society on September 2003).

In addition, the fact that it is also possible to use a change in the electrostatic capacity corresponding with strain instead of using the piezoresistive effect of the gauge resistor is explained in "Development of three-weight sensor" 'Invention' Journal pages 52 to 63, published by the Invention Society on September 2003.

In particular, the characteristic of the invention that is described in "Development of three-weight sensor" 'Invention' Journal pages 52 to 63, published by the Invention Society on September 2003 is the fact that it is possible, by means of force sensors for a plurality of axial directions formed on a semiconductor substrate, to constitute sensors of a plurality of types, that is, sensors of four types, namely, a three-axis force sensor, a three-axis acceleration sensor, a three-axis angular speed sensor, and a six-axis motion sensor by means of one device.

Proposals have been made for each of a variety of problems relating to a semiconductor acceleration sensor that employs the principles mentioned in "Development of three-weight sensor" 'Invention' Journal pages 52 to 63, published by the Invention Society on September 2003. One of these various problems is that a large unforeseen shock can sometimes be applied as a result of the environment in which the acceleration sensor is applied (depending on what kind of device the acceleration sensor is used in). In such a case, there is a risk that the weight will be displaced greatly and the gauge resistor will be accordingly damaged.

In order to eliminate this inconvenience, a constitution in which a stopper that limits the displacement of the weight is provided has been proposed (Japanese Patent Application Laid Open No. 2000-304762).

Here, as indicated in "Development of three-weight sensor" 'Invention' Journal pages 52 to 63, published by the Invention Society on September 2003 and in Japanese Patent publication H8-7228, an acceleration sensor with a structure in which the relationship between the weight and support portion is reversed, that is, in which the support portion is placed in the center of the acceleration sensor and the weight is suspended by means of a beam portion at the periphery of the support portion, is known. In the following description, an acceleration sensor with this structure is expediently referred to as a parasol-type acceleration sensor.

An acceleration sensor with a parasol-type acceleration sensor structure in which this support portion is placed in the center is illustrated in "Development of three-weight sensor" 'Invention' Journal pages 52 to 63, published by the Invention Society on September 2003, Japanese Patent Application Laid Open No. 2000-304762, and Japanese Patent publication H8-7228. However, the application of a structure that limits shocks of the acceleration sensor shown in Japanese Patent Application Laid Open No. 2000-304762 to a parasol-type acceleration sensor is not suggested.

SUMMARY OF THE INVENTION

Therefore, an object of the present invention is to propose a structure with superior shock resistance for an acceleration sensor having a structure in which the support portion is placed in the center, that is, a parasol-type acceleration sensor, such that there is no damage to the acceleration sensor even when the product on which the acceleration sensor is mounted is dropped or a strong shock is applied.

The first aspect of the acceleration sensor according to the object of the present invention comprises a support portion the lower end of which is fixed to a substrate; a beam portion on which a detection element for applying changes to an output signal in correspondence with strain caused by acceleration acting on the detection element is formed, one end of the beam portion being connected to the top part of the support portion; a suspended weight connected to the other end of the beam portion; and a stopper substrate with a window portion through which, in order to guide an output signal of the detection element via a pad that is formed on the upper end face of the support portion, a conductor lead that is connected to the pad passes, wherein the stopper substrate is fixed by means of adhesive to a region surrounding the pad of the upper end face of the support portion and upward overswing of the weight is limited by means of the stopper substrate.

The second aspect of the acceleration sensor according to the object of the present invention comprises a support portion the lower end of which is fixed to a substrate and the upper end face of which comprises a pad; four beam portions the respective one end of which is connected to the upper end portion of the support portion in an orthogonal direction with the support portion at the center and on which a detection element that applies changes to the output signal in correspondence with strain caused by acceleration acting on the detection element is formed; a suspended weight connected to the other end of the four beam portions; a support-portion extension part disposed between two adjacent beam portions of the four beam portions; and a stopper substrate with a window portion through which, in order to guide an output signal of the detection element via a pad that is formed on the upper end face of the support portion, a conductor lead that is connected to the pad passes, wherein the stopper substrate is fixed by means of adhesive to the extension of the support portion and limits upward overswing of the weight.

The third aspect of the acceleration sensor according to the object of the present invention comprises a support portion the lower end of which is fixed to a substrate and the upper end face of which comprises a pad; four beam portions the respective one end of which is connected to the upper end portion of the support portion in an orthogonal direction with the support portion at the center and on which a detection element that applies changes to the output signal in correspondence with strain caused by acceleration acting on the detection element is formed; a suspended weight connected to the other end of the four beam portions; a support-portion extension that is disposed between two adjacent beam portions of the four beam portions; and a stopper substrate with a window portion through which, in order to guide an output signal of the detection element via a pad that is formed on the extension of the support portion, a conductor lead that is connected to the pad passes, wherein the stopper substrate is fixed by means of adhesive to the upper end face of the support portion and limits upward overswing of the weight.

The fourth aspect of the acceleration sensor according to the object of the present invention comprises a support portion the lower end of which is fixed to a substrate; a beam portion on which a detection element for applying changes to an output signal in correspondence with strain caused by acceleration acting on the detection element is formed, one end of the beam portion being connected to the top part of the support portion; a suspended weight connected to the other end of the beam portion; a stopper substrate with a window portion through which, in order to guide an output signal of the detection element via a pad that is formed on the upper end face of the support portion, a conductor lead that is connected to the pad passes; and a frame portion that surrounds the weight, wherein the stopper substrate is fixed by means of adhesive to the upper end face of the frame portion and limits upward overswing of the weight.

The fifth aspect of the acceleration sensor according to the object of the present invention is an acceleration sensor according to any of the first to third aspects, wherein the support portion, beam portion and weight are integrally formed by means of a semiconductor substrate.

The sixth aspect of the acceleration sensor according to the object of the present invention is an acceleration sensor according to the fourth aspect, wherein the support portion, beam portion, weight and frame portion are integrally formed by means of a semiconductor substrate and the weight and frame portion are connected by means of a join portion and the frame portion is separated from the weight by cutting the join portion after mounting in the package.

The seventh aspect of the acceleration sensor according to the object of the present invention is an acceleration sensor according to the second aspect, further comprising a groove between the extension of the support portion and the pad formed on the upper end face of the support portion.

The eighth aspect of the acceleration sensor according to the object of the present invention is an acceleration sensor according to the first to seventh aspects, wherein the interval between the weight and the stopper substrate is 2 to 12 μm.

The characteristics of the present invention will become clearer from the embodiments of the invention that are described hereinbelow with reference to the drawings.

According to the characteristics of the present invention, it is possible to provide an acceleration sensor in which the shock resistance is improved at low cost and which exhibits high connection reliability.

BRIEF DESCRIPTION OF THE DRAWINGS

FIG. 2 shows a first embodiment structure of the present invention;

FIG. 3 shows a second embodiment structure of the present invention;

FIG. 4 shows a third embodiment structure of the present invention;

FIG. 5 shows a fourth embodiment structure of the present invention;

DESCRIPTION OF THE PREFERRED EMBODIMENTS

Embodiments of the present invention will be described hereinbelow with reference to the drawings.

FIG. 1 shows a parasol-type acceleration sensor chip.

Figure 1B:
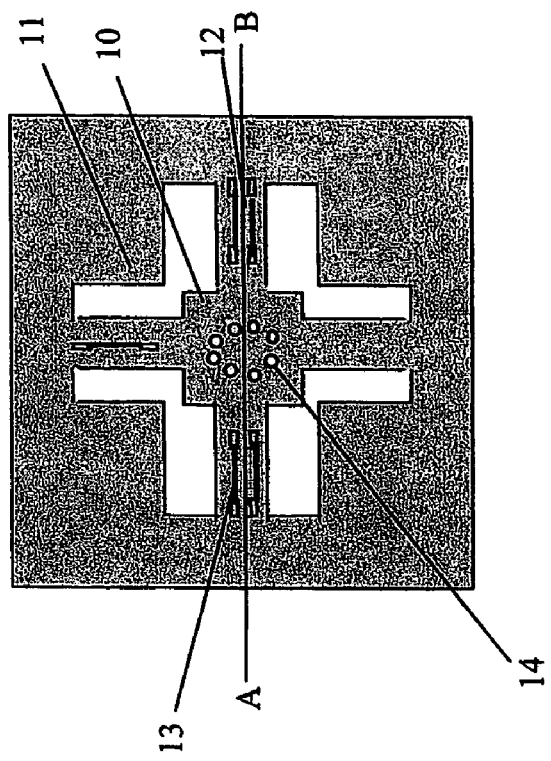
FIG. 1 shows a parasol-type acceleration sensor chip.
Figure 1A:
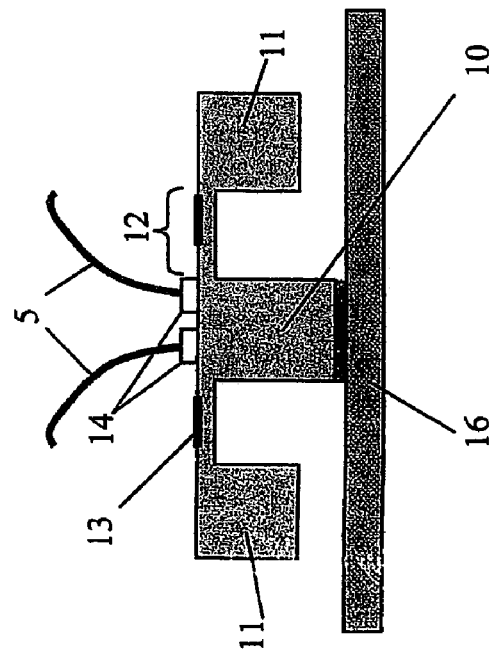

FIG. 1A is a cross-sectional view and FIG. 1B is an upper view. Further, the cross-sectional view of FIG. 1A is a cross-sectional view along the line A-B in FIG. 1B.

In FIG. 1, the acceleration sensor chip comprises a support portion 10 that is fixed to the center of a substrate 16, and a weight 11 that is disposed at the periphery of the support portion 10.

The weight 11 is suspended linked to the other end of a beam portion (detection beam) 12 one end of which is connected to the top part of the support portion 10. The beam portion 12 is flexible so that when the stress or acceleration is applied, the beam portion 12 may strain. The support portion 10, weight 11, and beam portion 12 are integrally formed by means of a semiconductor substrate by means of micromachine technology.

A detection element 13 that applies changes to the output signal in correspondence with the strain caused by the acceleration acting on the weight 11 is formed on the top part of the beam portion 12.

Here, the substrate 16 fulfills the role of a stopper for the downward movement of the weight 11.

A plurality of bonding pads 14 are provided on the upper end face of the support portion 10 in the upper view shown in FIG. 1B. The bonding pads 14 are electrically connected by means of leads (not shown) to the detection element 13. The bonding pads 14 are connected by means of a metal wire 5 or similar to an external lead-out terminal that is formed on the side of the package (not illustrated).

In the case of the acceleration sensor chip shown in FIG. 1, the downward movement of the weight 11 is limited by means of the substrate 16 but the upward movement of the weight 11 is unrestricted. Therefore, when a large shock is applied to the acceleration sensor, there is the risk of damage to the beam portion 12 as described earlier.

Therefore, the present invention proposes a structure to resolve this problem.

FIG. 2 shows the first embodiment structure of the acceleration sensor of the present invention. In FIG. 2, FIG. 2A is a cross-sectional view of the first embodiment; FIG. 2B is an upper view in which the acceleration sensor chip (the part circled by a broken line part 2 in FIG. 2A) housed within the package is observed with the upper stopper substrate 15 (FIG. 2C) removed; FIG. 2D is an upper view of a state where the upper stopper substrate 15 is covered. Further, FIG. 2A is a cross-sectional view along the broken line A-B in FIG. 2B.

In FIG. 2A, the package is formed in multiple layers (three layers in this embodiment) by means of ceramic material.

The acceleration sensor chip 2 is housed in a package and the acceleration sensor chip 2 comprises a support portion 10 that is centrally fixed to the substrate 16, and a weight 11 that is disposed at the periphery of the support portion 10. The weight 11 is suspended linked to the other end of the beam portion (detection beam) 12 one end of which is connected to the top part of the support portion 10. The support portion 10, weight 11 and beam portion 12 are integrally formed by means of a semiconductor substrate by means of micromachine technology.

A detection element 13 that applies changes to the output signal in correspondence with the strain caused by the acceleration acting on the weight 11 is formed on the top part of the beam portion 12.

Here, the substrate 16 fulfills the role of a stopper for the downward movement of the weight 11. The substrate 16 is also fixed to the inside bottom face of the package by means of adhesive 17.

A plurality of bonding pads 14 are provided on the upper end face of the support portion 10 in the upper view shown in FIG. 2B. The bonding pads 14 are electrically connected by means of leads (not shown) to the detection element 13.

In addition, the bonding pads 14 are connected by means of a metal wire 5 or similar to the external lead-out terminal 4 that is formed on the side of the package (not illustrated).

The external lead-out terminal 4 is also connected to an electrode terminal 18 that is formed on the package bottom face by means of an electrically conductive film that is formed along the package wall. The electrode terminal 18 is soldered to the required circuit parts of the substrate when the acceleration sensor is mounted on the circuit substrate.

Here, the present invention is characterized by further comprising the upper stopper substrate 15 that fulfils the role of a stopper for the upward movement of the weight 11. The upper stopper substrate 15 is bonded by means of adhesive 15b formed to surround the plurality of bonding pads 14 to the upper end face of the support portion 10.

FIG. 2C is a planar view of the upper stopper substrate 15 that fulfils the role of a stopper to limit the overswing of the upward movement of the weight 11. The upper stopper substrate 15 comprises a window portion 15a at the center thereof. Therefore, the connecting wires 5 are able to connect the bonding pads 14 and external lead-out terminals 4 via the window portion 15a of the upper stopper substrate 15.

FIG. 3 shows the second embodiment structure of the present invention. In FIG. 3, FIG. 3A is a cross-sectional view of the second embodiment; FIG. 3B is an upper view in which the acceleration sensor chip (part circled by the broken line portion 2 in FIG. 3A) housed in the package is observed with the upper stopper substrate 15 (FIG. 3C) removed; and FIG. 3D is an upper view of a state where the upper stopper substrate 15 is covered. Further, the cross-sectional view of FIG. 3A is a view along the broken line A-B in FIG. 3B.

In FIG. 3A, the package is formed in three layers by means of ceramic material similarly to the example in FIG. 2.

The acceleration sensor chip 2 is housed in a package and the acceleration sensor chip 2 comprises a support portion 10 that is centrally fixed to the substrate 16, and an weight 11 that is disposed at the periphery of the support portion 10. The weight 11 is suspended linked to the other end of the beam portion (detection beam) 12 one end of which is connected to the top part of the support portion 10. The support portion 10, weight 11 and beam portion 12 are integrally formed by means of a semiconductor substrate by means of micromachine technology.

A detection element 13 that applies changes to the output signal in correspondence with the strain caused by the acceleration acting on the weight 11 is formed on the top part of the beam portion 12.

The substrate 16 fulfils the role of a stopper for the downward movement of the weight 11. The substrate 16 is also fixed to the inside bottom face of the package by means of adhesive 17.

A plurality of bonding pads 14 are provided on the upper end face of the support portion 10 in the upper view shown in FIG. 3B. The bonding pads 14 are electrically connected by means of leads (not shown) to the detection element 13.

The bonding pads 14 are also connected by means of a metal wire 5 or similar to an external lead-out terminal that is formed on the side of the package.

The external lead-out terminal 4 is connected to an electrode terminal 18 that is formed on the package bottom face by means of an electrically conductive film that is formed along the package wall. The electrode terminal 18 is soldered to the required circuit parts of the substrate when the acceleration sensor is mounted on the circuit substrate.

Here, so too with the third embodiment, the present invention is characterized by further comprising the stopper substrate 15 that fulfils the role of a stopper for the upward movement of the weight 11. In the second embodiment, the weight 11 forms a substantially square frame shape with four sides, the center of each of the four sides being connected to the other end of the beam portion (detection beam) 12 and linked to the middle support portion 10. In addition, in comparison with the first embodiment in FIG. 2, in the case of the third embodiment, the middle support portion 10 comprises extension parts 11a to 11d of the support portion that extend in an oblique direction at an angle to the beam portion (detection beam) 12.

Furthermore, a characteristic of this embodiment is that the upper stopper substrate 15 is bonded by means of adhesive 15b to extension parts 10a to 10d of the support portion 10. FIG. 3C is a planar view of the upper stopper substrate 15 that fulfils the role of a stopper to limit the overswing of the upward movement of the weight 11. Similarly to the first embodiment, the upper stopper substrate 15 comprises a window portion 15a at the center thereof. Therefore, the connecting wires 5 are able to connect the bonding pads 14 and external lead-out terminals 4 via the window portion 15a of the upper stopper substrate 15.

In comparison with the first embodiment, the second embodiment shown in FIG. 3 is a constitution in which the upper stopper substrate 15 is bonded at four points spaced apart from the plurality of bonding pads 14, whereby the bonding strength can be increased and the flow of adhesive 15b to the bonding pads 14 can be prevented. Deterioration of the electrical connection can therefore be prevented.

FIG. 4 shows the third embodiment structure of the present invention. In FIG. 4, FIG. 4A is a cross-sectional view of the third embodiment; FIG. 4B is an upper view in which the acceleration sensor chip (part circled by the broken line portion 2 in FIG. 4A) housed in the package is observed with the upper stopper substrate 15 (FIG. 4C) removed; and FIG. 4D is an upper view of a state where the upper stopper substrate 15 is covered. Further, the cross-sectional view of FIG. 4A is a view along the broken line A-B in FIG. 4B.

In FIG. 4A, the package is formed in three layers by means of ceramic material similarly to the earlier embodiments in FIGS. 2 and 3.

The acceleration sensor chip 2 is housed in a package and the acceleration sensor chip 2 comprises a support portion 10 that is centrally fixed to the substrate 16, and an weight 11 that is disposed at the periphery of the support portion 10. The weight 11 is suspended linked to the other end of the beam portion (detection beam) 12 one end of which is connected to the top part of the support portion 10. The support portion 10, weight 11 and beam portion 12 are integrally formed by means of a semiconductor substrate by means of micromachine technology.

A detection element 13 that applies changes to the output signal in correspondence with the strain caused by the acceleration acting on the weight 11 is formed on the top part of the beam portion 12.

The substrate 16 fulfils the role of a stopper for overswing of the downward movement of the weight 11. The substrate 16 is also fixed to the inside bottom face of the package by means of adhesive 17.

Here, so too with the fourth embodiment, similarly to the earlier embodiments, the present invention is characterized by comprising the stopper substrate 15 that fulfils the role of a stopper for the upward movement of the weight 11. Similarly to the second embodiment in FIG. 3, the weight 11 forms a substantially square frame shape with four sides, the center of each of the four sides being connected to the other end of the beam portion (detection beam) 12 and linked to the middle support portion 10. In addition, the middle support portion 10 comprises extension parts 11a to 11d of the support portion that extend in an oblique direction at an angle to the beam portion (detection beam) 12.

The difference of the fourth embodiment from the second embodiment shown in FIG. 3 is the position of the plurality of bonding pads 14. That is, in the embodiment shown in FIG. 4, the plurality of bonding pads 14 are arranged on four extension parts 11a to 11d of the extended support portion. Therefore, the upper stopper substrate 15 comprises four window portions 15a for connecting a lead-out wire such as the metal wire 5 to the bonding pads 14 in correspondence with the four extension parts 11a to 11d respectively.

Furthermore, the upper stopper substrate 15 is connected to the support portion 10 by means of adhesive 15b that is formed on the upper end of the support portion 10.

In the fourth embodiment, the bonding pads 14 are in positions spaced apart from the center and, therefore, the length of lead-out wires such as the metal wire 5 for a connection with the external lead-out terminal 4 may be made shorter than in the case of the first and second embodiments, whereby reliability can be increased.

FIG. 5 also illustrates the fourth embodiment of the present invention. In FIG. 5, FIG. 5A is a cross-sectional view of the fourth embodiment; FIG. 5B is an upper view in which the acceleration sensor chip (part circled by the broken line portion 2 in FIG. 5A) housed in the package is observed with the upper stopper substrate 15 (FIG. 5C) removed; and FIG. 5D is an upper view of a state where the upper stopper substrate 15 is covered. Further, the cross-sectional view of FIG. 5A is a view along the broken line A-B in FIG. 5.

This embodiment is a constitution in which a frame 19 for holding the upper stopper substrate 15 is provided independently of the acceleration sensor chip 2. As shown in FIG. 5C, the upper stopper substrate 15 comprises a window portion 15a through which lead-out wire such as the metal wire 5 for connecting the bonding pads 14 and external lead-out terminals 4 is passed as per the other embodiments.

The window portion 15a forms a square in this embodiment but may also form another shape such as a circle, for example. In addition, in FIG. 5, the plurality of bonding pads 14 is formed on the end face of the support portion 10 similarly to the second and third embodiments. However, the bonding pads 14 may also be formed on each of the four extension parts 11a to 11d as per the fourth embodiment.

Figure 6:
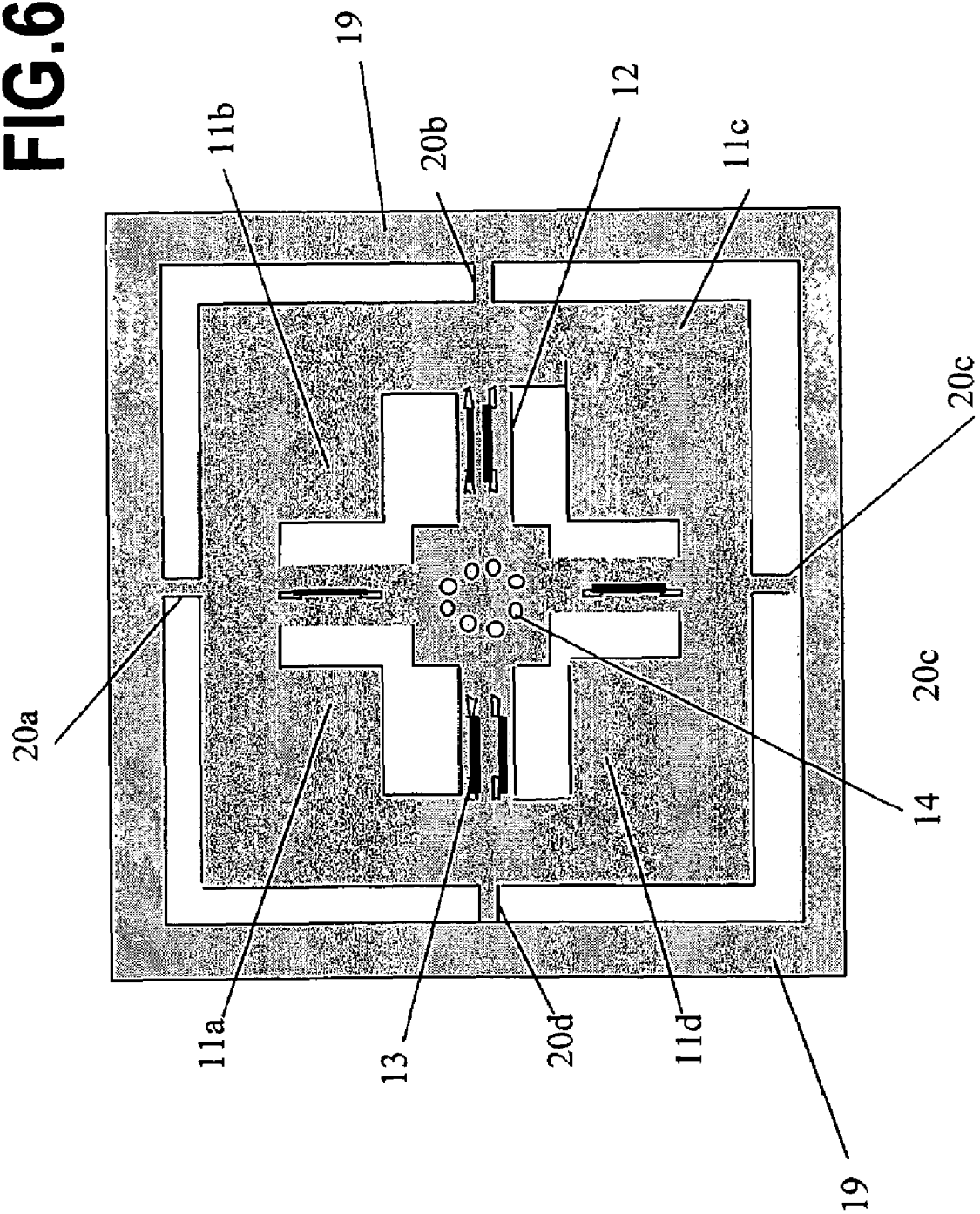
FIG. 6 illustrates the constitution of the fabrication process for an acceleration sensor chip 2 and a frame 19 of the embodiment in FIG. 5.

FIG. 6 illustrates the constitution of the fabrication process for the acceleration sensor chip 2 and frame 19 of the embodiment in FIG. 5. The acceleration sensor chip 2 and frame 19 can be fabricated by cutting same from a semiconductor substrate by means of micromachine technology. Thus, machining is performed by leaving parts 20a to 20d that link the parts of the frame 19 and acceleration sensor chip 2.

Thereafter, the frame 19 is afforded a structure that is produced by fixing the frame 19 to the upper stopper substrate 15 or substrate 16 through bonding and then cutting the frame 19 from the body of the acceleration sensor chip by means of a laser. As a result, collective die-bonding of the external lead-out terminals 4 of package 1 and bonding pads 14 of the sensor chip is possible and an easily-fabricated sensor with superior shock resistance that can be provided.

Figure 7:
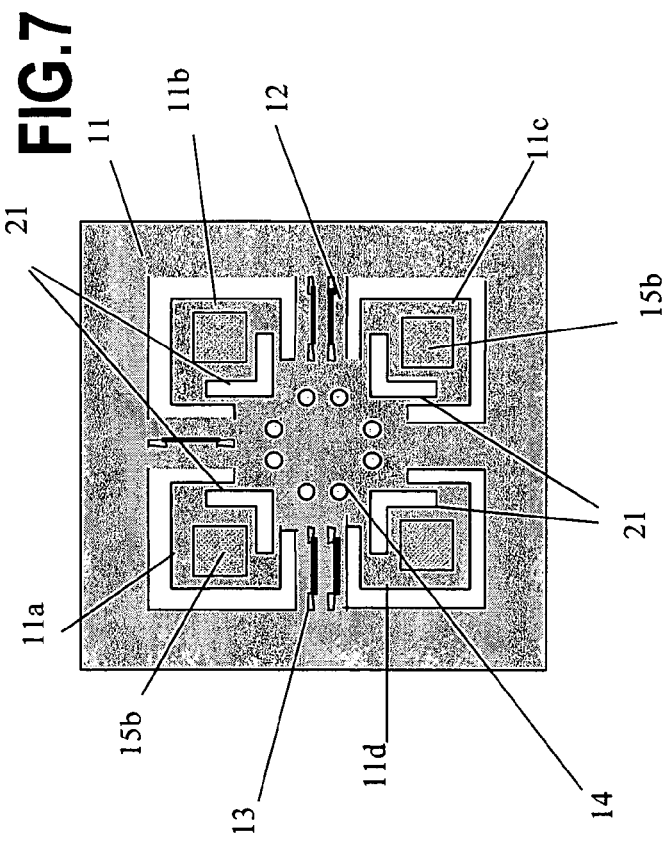
FIG. 7 is a modified example of the embodiment shown in FIG. 3.

FIG. 7 is a modified example of the embodiment shown in FIG. 3. This modified example is characterized in that grooves 21 are formed between the adhesive 15b for fixing the upper stopper substrate 15 formed on the four extension parts 11a to 11d and the bonding pads 14. As a result of forming these grooves 21, the risk of adhesive 15b flowing to the part of the bonding pads 14 can be avoided. Accordingly, an acceleration sensor with superior shock resistance with which electrical connection reliability is high can be provided.

Figure 8:
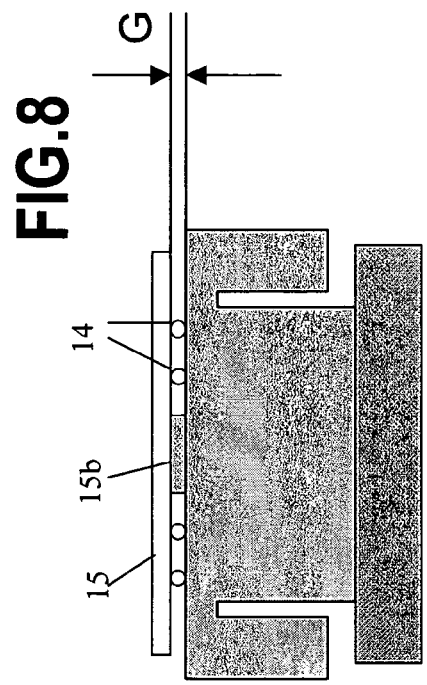
FIG. 8 illustrates a gap G between an weight 11 and upper stopper substrate 15 of an acceleration sensor common to each embodiment.

FIG. 8 illustrates a gap G between the weight 11 and upper stopper substrate 15 of an acceleration sensor common to each embodiment. It is possible to limit the upward movement of the weight 11 by making the gap G approximately 2 to 12 μm by means of the adhesive 15b or by inserting a spacer. As a result, the reliability of the shock resistance can be improved.

The present invention makes it possible to provide an acceleration sensor with superior shock resistance by means of a simple constitution. It is thus possible to provide highly reliable electronic devices by installing the acceleration sensor according to the present invention.

What is claimed is:

1. An acceleration sensor, comprising:
    a support portion a lower end of which is fixed to a substrate;
    a beam portion on which a detection element for applying changes to an output signal in correspondence with strain caused by acceleration acting on the detection element is formed, one end of the beam portion being connected to an upper end of the support portion;

a suspended weight connected to another end of the beam portion; and a stopper substrate with a window portion through which, in order to guide an output signal of the detection element via a pad that is formed on the upper end face of the support portion, a conductor lead that connects the pad connects to a terminal outside the stopper substrate, wherein the stopper substrate is fixed by means of adhesive to a region on the upper end face of the support portion, surrounding the pad formed on the upper end face of the support portion and upward overswing of the weight is limited by means of the stopper substrate.

2. The acceleration sensor according to claim 1, wherein the support portion, beam portion and weight are integrally formed by means of a semiconductor substrate.

3. The acceleration sensor according to claim 1, wherein the interval between the weight and the stopper substrate is 2 to 12 μm.

* * * * *